United States Patent
Lee et al.

(10) Patent No.: US 8,854,564 B2
(45) Date of Patent: Oct. 7, 2014

(54) SUBSTRATE FOR A DISPLAY DEVICE AND METHOD OF MANUFACTURING THE SAME

(71) Applicant: Samsung Display Co., Ltd., Yongin (KR)

(72) Inventors: Mi-Sun Lee, Goyang-si (KR); Shin-Tack Kang, Seongnam-si (KR)

(73) Assignee: Samsung Display Co., Ltd., Yongin, Gyeonggi-Do (LR)

( * ) Notice: Subject to any disclaimer, the term of this patent is extended or adjusted under 35 U.S.C. 154(b) by 0 days.

(21) Appl. No.: 13/938,541

(22) Filed: Jul. 10, 2013

(65) Prior Publication Data

US 2013/0294004 A1 Nov. 7, 2013

Related U.S. Application Data

(62) Division of application No. 12/727,885, filed on Mar. 19, 2010, now Pat. No. 8,520,158.

(30) Foreign Application Priority Data

Oct. 26, 2009 (KR) .......................... 10-2009-0101528

(51) Int. Cl.
*G02F 1/1333* (2006.01)
*G02F 1/1345* (2006.01)
*H01L 21/66* (2006.01)
*H05F 1/00* (2006.01)
*G02F 1/13* (2006.01)

(52) U.S. Cl.
CPC *H05F 1/00* (2013.01); *H01L 22/14* (2013.01); *G02F 2202/22* (2013.01); *G02F 1/1345* (2013.01); *G02F 1/1309* (2013.01); *G02F 1/133351* (2013.01)
USPC ............................................. 349/40; 349/152

(58) Field of Classification Search
USPC ........................................................... 349/40
See application file for complete search history.

(56) References Cited

U.S. PATENT DOCUMENTS

| | | | |
|---|---|---|---|
| 6,211,534 B1 * | 4/2001 | Matsumoto ..................... | 257/59 |
| 6,278,504 B1 | 8/2001 | Sung | |
| 2004/0027502 A1 * | 2/2004 | Tanaka et al. .................. | 349/40 |
| 2004/0046920 A1 | 3/2004 | Hayata et al. | |
| 2006/0194368 A1 * | 8/2006 | Hong et al. ................... | 438/109 |
| 2007/0085112 A1 | 4/2007 | Yamazaki et al. | |
| 2007/0273802 A1 | 11/2007 | Nakamura | |
| 2008/0106661 A1 | 5/2008 | Kim et al. | |
| 2009/0310051 A1 | 12/2009 | Kim | |

* cited by examiner

*Primary Examiner* — Edward J. Glick
*Assistant Examiner* — Dennis Y Kim
(74) *Attorney, Agent, or Firm* — F. Chau & Associates, LLC

(57) ABSTRACT

A mother substrate for a display device includes a display cell, a test pad, an electrostatic preventing pattern and a connecting line. The display cell includes a pad and a signal line. The signal line is extended from the pad and is electrically connected to a pixel. The test pad is disposed out of the display cell and is electrically connected to the signal line of the display cell and receives a test signal. The electrostatic preventing pattern electrically connected to the test pad is disposed adjacent to the test pad and includes a plurality of edges. The electrostatic preventing pattern is formed from a metal pattern. The connecting line is extended from the electrostatic preventing pattern and is electrically connected to the pad of the display cell.

10 Claims, 10 Drawing Sheets

SUBSTRATE FOR A DISPLAY DEVICE AND METHOD OF MANUFACTURING THE SAME

CROSS REFERENCE TO RELATED APPLICATION

This application is a Division of co-pending U.S. patent application Ser. No. 12/727,885, filed Mar. 19, 2010, which claims priority under 35 U.S.C. §119 to Korean Patent Application No. 10-2009-0101528, filed on Oct. 26, 2009 in the Korean Intellectual Property Office (KIPO), the contents of which are herein incorporated by reference in their entirety.

BACKGROUND OF THE INVENTION

1. Technical Field

The present invention relates to a display device. More particularly, the present invention relates to a substrate for a display device and a method of manufacturing the substrate.

2. Discussion of the Related Art

Generally, a liquid crystal display (LCD) panel includes an array substrate, an upper substrate facing the array substrate, and a liquid crystal layer interposed between the array substrate and the upper substrate. The array substrate includes a display area in which a plurality of lines and a plurality of thin-film transistors connected to the lines are formed, and a peripheral area in which pads applying an electric signal to the lines are formed.

After the array substrate is manufactured, an array test process is performed to inspect the lines for potential defects. Array test pads are formed on a mother substrate of the array substrate to facilitate the process of testing for defects. The array test pads are electrically connected to the lines. The array test process inspects the defect of the lines by applying a test signal through the array test pads.

During the array test process, an accumulated electric charge of static electricity may flow through the array test pads and the lines and the thin-film transistors that are to formed on the array substrate may be damaged. Therefore, the static electricity may cause a decrease in manufacturing yield and a poor quality of products.

SUMMARY OF THE INVENTION

Exemplary embodiments of the present invention provide a mother substrate for a display device that reduces or prevents damage due to static electricity.

Exemplary embodiments of the present invention also provide a method of manufacturing the mother substrate.

According to one aspect of the present invention, a mother substrate for a display device includes a display cell, a test pad, an electrostatic preventing pattern and a connecting line. The display cell includes a pad and a signal line and the signal line extended from the pad is electrically connected to a pixel. The test pad disposed out of the display cell is electrically connected to the signal line of the display cell and receives a test signal. The electrostatic preventing pattern electrically connected to the test pad is disposed adjacent to the test pad and includes a plurality of edges. The electrostatic preventing pattern is formed from a metal pattern. The connecting line is extended from the electrostatic preventing pattern and is electrically connected to the pad of the display cell.

According to an aspect of the present invention, a mother substrate for a display device includes a display cell, a test pad, an electrostatic preventing pattern and a connecting line. The display cell includes a pad and a signal line and the signal line is extended from the pad and electrically connected to a pixel. The test pad disposed out of the display cell is electrically connected to the signal line of the display cell and receives a test signal. The electrostatic preventing pattern electrically connected to the test pad is disposed adjacent to the test pad and includes a first preventing pattern having a plurality of patterns that is discontinuously disposed and a second preventing pattern overlapping with the patterns. The connecting line is extended from the second preventing pattern and is electrically connected to the pad of display cell.

According to an aspect of the present invention, in a method of manufacturing a mother substrate, a first metal pattern including a gate line, a storage line and a gate electrode of a transistor is formed in a display cell region on a base substrate. A second metal pattern including a data line formed in the display cell region on the base substrate on which the first metal pattern is formed, a first pad electrode of a test pad formed out of the display cell region, an electrostatic preventing pattern including a plurality of edges and a connecting line electrically connecting the test pad to a pad connected to the data line, is formed. A transparent electrode pattern including a pixel electrode electrically connected to the transistor on the base substrate on which the second metal pattern is formed and a second pad electrode electrically connected to the first pad electrode, is formed.

According to an aspect of the present invention, in a method of manufacturing a mother substrate, a first metal pattern including a gate line, a storage line and a gate electrode of a transistor in a display cell region on a base substrate and a first preventing pattern discontinuously disposed out of the display cell region, is formed. A second metal pattern including a data line formed in the display cell region on the base substrate on which the first metal pattern is formed, a first pad electrode of a test pad formed out of the display cell region, a second preventing pattern overlapping with the first preventing pattern and a connecting line electrically connecting the test pad to a pad connected to the data line, is formed. A transparent electrode pattern including a pixel electrode electrically connected to the transistor on the base substrate on which the second metal pattern is formed and a second pad electrode electrically connected to the first pad electrode, is formed.

According to some exemplary embodiments of the present invention, an electrostatic preventing pattern having a simple structure is included and damage due to static electricity may be reduced or prevented and a manufacturing process may be simplified.

BRIEF DESCRIPTION OF THE DRAWINGS

The above and other features and aspects of exemplary embodiments of the present invention will be described in detail below with reference to the accompanying drawings, in which.

DETAILED DESCRIPTION OF EXEMPLARY EMBODIMENTS

Figure 1:
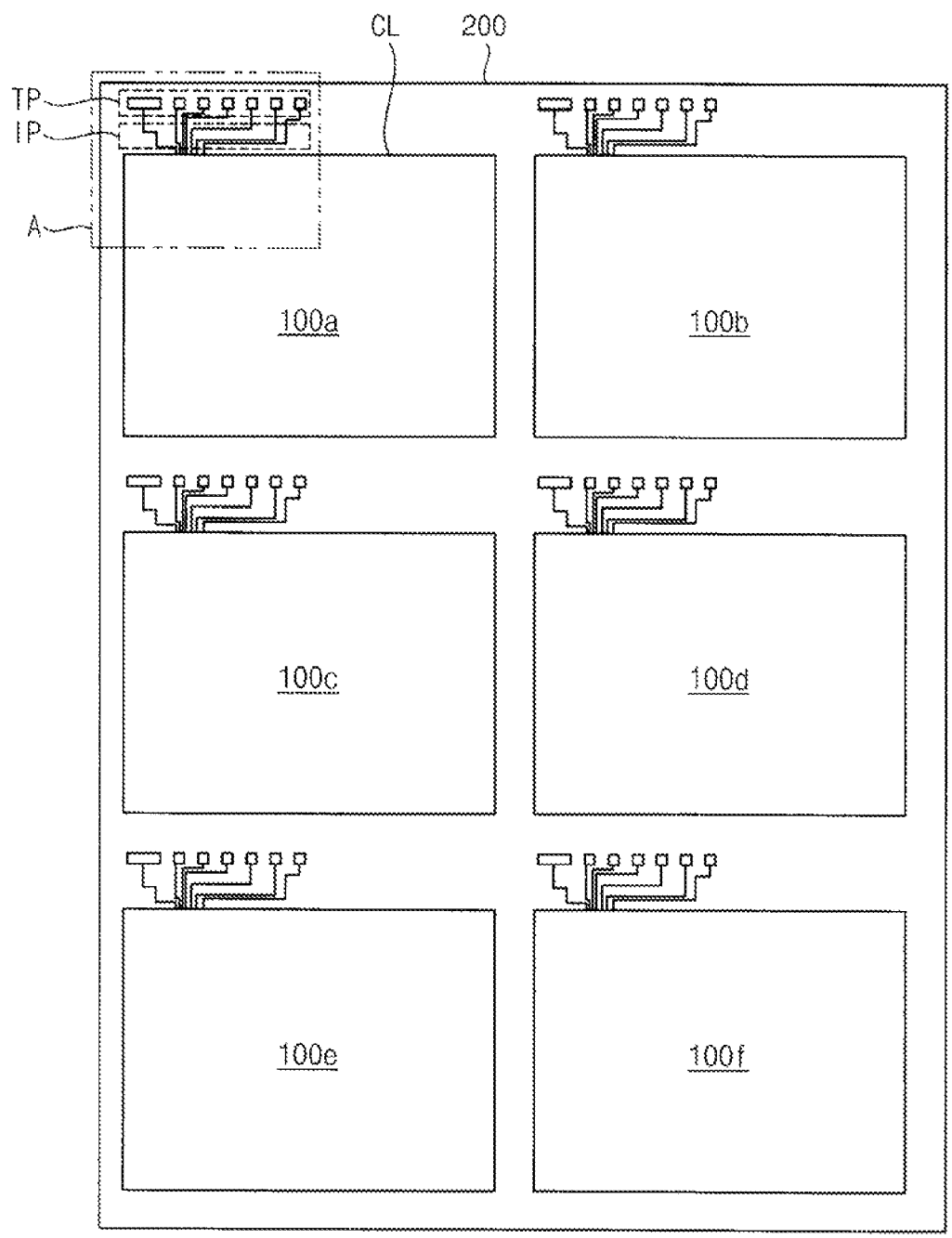
FIG. 1 is a plan view illustrating a mother substrate according to an exemplary embodiment of the present invention.

Exemplary embodiments of the present invention are described more fully hereinafter with reference to the accompanying drawings. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

Hereinafter, exemplary embodiments of the present invention will be explained in detail with reference to the accompanying drawings.

Figure 2:
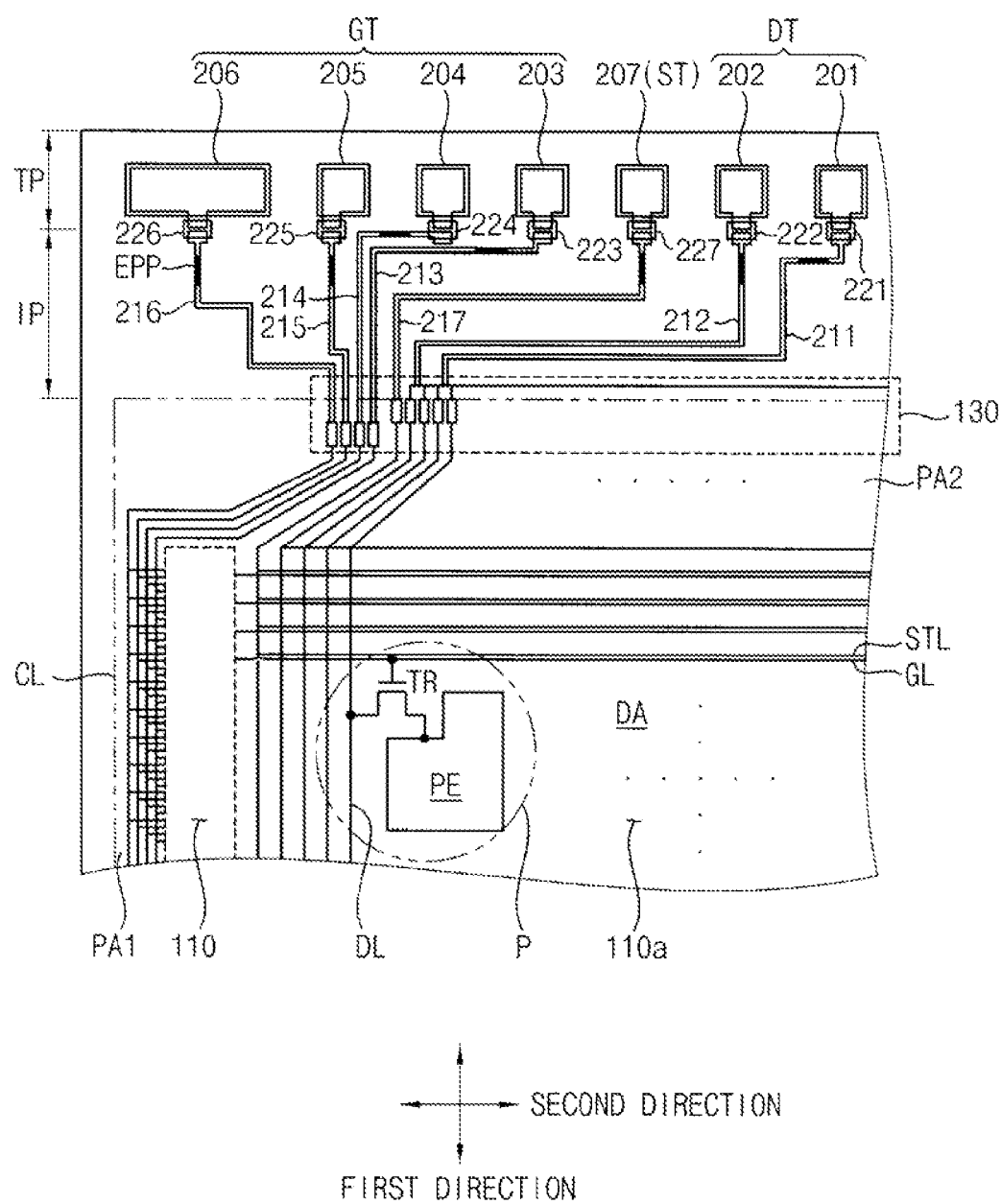
FIG. 2 is an enlarged view of a portion "A" of the mother substrate of FIG. 1.

FIG. 1 is a plan view illustrating a mother substrate according to an exemplary embodiment of the present invention. FIG. 2 is an enlarged view of a portion "A" of the mother substrate of FIG. 1.

Referring to FIGS. 1 and 2, the mother substrate 200 includes a plurality of display cells 100a, 100b, 100c, 100d, 100e, and 100f, a cutting line CL defining each display cell 100a, a test pad portion TP corresponding to each display cell 100a and a signal input portion IP.

The display cell 100a includes a display area DA and a plurality of peripheral areas PA1 and PA2 surrounding the display area DA. A plurality of signal lines is formed in the display area DA. The signal lines include a plurality of data lines DL, a plurality of gate lines GL, a plurality of storage lines STL and a plurality of pixels P. The data lines DL may be extended in a first direction D1. The gate lines GL may be extended in a second direction D2 crossing the first direction D1. The storage lines STL may be extended in the second direction D2. Each of the pixels P includes a transistor TR and a pixel electrode PE connected to the transistor TR.

The first peripheral areas PA1 is an area adjacent to an end portion of the gate lines GL. A gate driving circuit 110 sequentially applying a gate signal to the gate lines GL is disposed in the first peripheral areas PA1. The gate driving circuit 110 includes a plurality of transistors, and is formed in the first peripheral areas PA1 through the same process for the transistor TR formed in the display area DA.

The second peripheral areas PA2 is an area adjacent to an end portion of the data lines DL. A pad portion 130 receiving a signal is disposed in the second peripheral areas PA2. The pad portion 130 includes a plurality of pads that receive signals provided to the data lines DL, the gate driving circuit 110 and the storage lines STL.

The cutting line CL defines the display cell 100a and the mother substrate is cut according to the cutting line CL in the following process.

The test pad portion TP includes a plurality of test pads and is electrically connected to the pad portion 130 of the display cell 100a. For example, the test pad portion TP includes a data testing portion DT, a gate testing portion GT and a storage testing portion ST.

The data testing portion DT receives a test signal for detecting an error of the data lines DL. The data testing portion DT may include a plurality of data test pads, for example, two data test pads 2D, three data test pads 3D, etc., according to a data test method. For example, according to a 2D test method, data pads of the data lines are divided into a first group and a second group. The data pads of the first group are electrically connected to a first test pad 201 and the data pads of the second group are electrically connected to a second test pad 202. The first group may be odd-numbered data pads and the second group may be even-numbered data pads.

The gate testing portion GT receives a test signal for detecting an error of the gate lines GL. The gate testing portion GT may include a third test pad 203, a fourth test pad 204, a fifth test pad 205 and a sixth test pad 206 according to an input signal of the gate driving circuit 110. The third test pad 203 is electrically connected to a pad receiving a vertical start signal of the gate driving circuit 110, the fourth test pad 204 is electrically connected to a pad receiving a first clock signal of the gate driving circuit 110, the fifth test pad 205 is electrically connected to a pad receiving a second clock signal of the gate driving circuit 110, and the sixth test pad 206 is electrically connected to a pad receiving a gate-off voltage of the gate driving circuit 110.

The storage testing portion ST receives a test signal for detecting an error of the storage lines STL. The storage testing portion ST is electrically connected to a seventh test pad 207 receiving a storage common voltage that is applied to the storage lines STL.

The signal input portion IP is disposed between the test pad portion TP and the cutting line CL, and transmits the test signal from the test pad portion TP to the pad portion 130 of the display cell 100a. The signal input portion IP includes a plurality of connecting line portions extended from the test pad portion TP to the pad portion 130 of the display cell 100a, and a plurality of connecting portions electrically connecting the test pad portion TP to the connecting line portions.

For example, a first connecting line portion 211 is extended from the first test pad 201 to be connected with the pad portion 130, and a second connecting line portion 212 is extended from the second test pad 202 to be connected with the pad portion 130. A third connecting line portion 213 is extended from the third test pad 203 to be connected with the pad portion 130, and a fourth connecting line portion 214 is extended from the fourth test pad 204 to be connected with the pad portion 130. A fifth connecting line portion 215 is extended from the fifth test pad 205 to be connected with the pad portion 130, a sixth connecting line portion 216 is extended from the sixth test pad 206 to be connected with the pad portion 130, and a seventh connecting line portion 217 is extended from the seventh test pad 207 to be connected with the pad portion 130.

Each of the connecting line portions 211 to 217 includes an electrostatic preventing pattern EPP. The electrostatic preventing pattern EPP is disposed adjacent to each of the test pads 201 to 207. The electrostatic preventing pattern EPP decreases a level of accumulated electrical charge that flows into the test pad portion TP, to prevent a damage of the display cell 100a due to the static electricity.

A first connecting portion 221 electrically connects the first test pad 201 to the first connecting line portion 211, and the second connecting portion 222 electrically connects the second test pad 202 to the second connecting line portion 212. A third connecting portion 223 electrically connects the third test pad 203 to the third connecting line portion 213, and the fourth connecting portion 224 electrically connects the fourth test pad 204 to the fourth connecting line portion 214. A fifth connecting portion 225 electrically connects the fifth test pad 205 to the fifth connecting line portion 215, the sixth connecting portion 226 electrically connects the sixth test pad 206 to the sixth connecting line portion 216, and the seventh connecting portion 227 electrically connects the seventh test pad 207 to the seventh connecting line portion 217.

Figure 3:
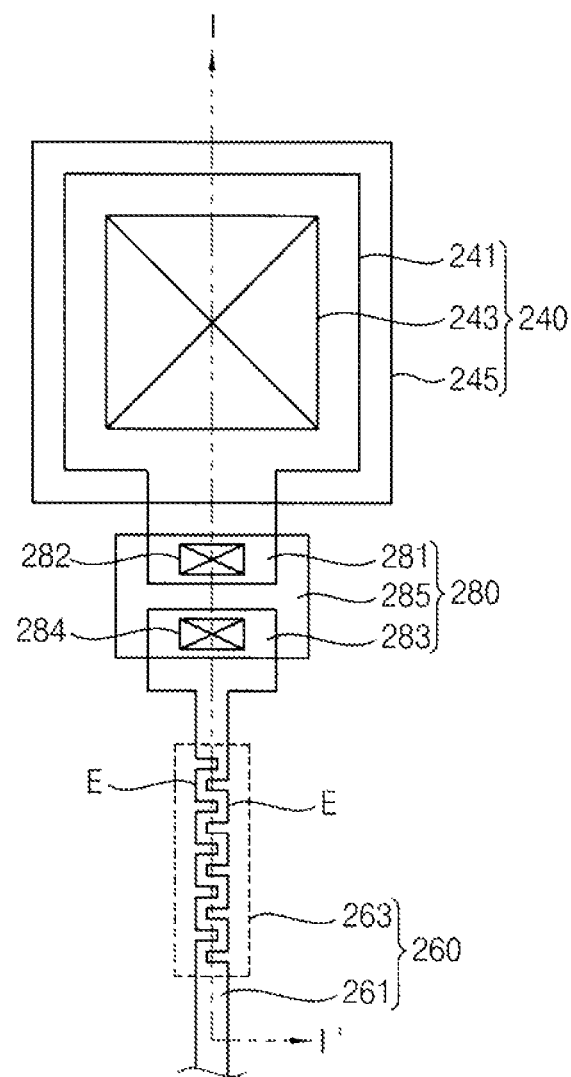
FIG. 3 is a plan view illustrating an electrostatic preventing pattern of FIG. 2.

FIG. 3 is a plan view illustrating an electrostatic preventing pattern (EPP) of FIG. 2.

Referring to FIGS. 2 and 3, the mother substrate 200 includes a test pad 240, a connecting line portion 260 and a connecting portion 280. The test pad 240, the connecting line portion 260 and the connecting portion 280 correspond to the test pads 201 to 207, the connecting line portions 211 to 217 and the connecting portions 221 to 227 illustrated in FIG. 2, respectively. Hereinafter, the present example embodiment will be explained in detail through the test pad 240, the connecting line portion 260 and the connecting portion 280 instead of the test pads 201 to 207, the connecting line portions 211 to 217 and the connecting portions 221 to 227.

The test pad 240 includes a first pad electrode 241 formed from a second metal layer, a first contact hole 243 formed on the first pad electrode 241, and a second pad electrode 245 formed from a transparent conductive layer and connected to the first pad electrode 241 through the first contact hole 243.

The connecting line portion 260 includes a connecting line 261 and an electrostatic preventing pattern 263 formed from the second metal layer. The connecting line 261 is extended from the electrostatic preventing pattern 263 to be electrically connected to the pad portion 130 of the display cell 100a. The electrostatic preventing pattern 263 is electrically connected to the connecting line 261 and is disposed adjacent to the test pad 240. The electrostatic preventing pattern 263 has a zigzag shape having a plurality of edges E.

As used herein, the zigzag shape of the electrostatic preventing pattern 263 may be a serpentine pattern of right angles whereby the pattern proceeds back and forth in a repeating pattern. However, the invention is not limited to this particular pattern and the pattern may proceed back and forth at any angle or may be sinusoidal.

The connecting portion 280 connects the test pad 240 to the connecting line portion 260. The connecting portion 280 includes a first end portion 281 electrically connected to the test pad 240, a second contact hole 282 formed on the first end portion 281, a second end portion 283 electrically connected to the connecting line portion 260, a third contact hole 284 formed on the second end portion 283 and a connecting electrode 285 connecting the first end portion 281 to the second end portion 283 through the second and third contact holes 282 and 284. The first and second end portions 281 and 283 may be formed from the second metal layer, and the connecting electrode 285 may be formed from the transparent conductive layer.

Although not shown in the figure, the first end portion 281 of the first pad electrode 241 formed from the second metal layer may be extended, and the connecting portion 280 may be directly connected to the connecting line 261 formed from the second metal layer. The connecting portion 280 indirectly connects the connecting line 261 to the first pad electrode 241 using the connecting electrode 285 formed from the transparent conductive layer through the second and third contact holes 282 and 284, and the presence static electricity may be reduced.

In an array test process, when a probe of a testing apparatus contacts the test pad 240, the static electricity concentrated at an end portion of the probe may produce an electric flow into the display cell 100a through the test pad 240. A size of the test pad 240 may be, for example, at least 2 mm and may be much larger than the other pattern. Therefore, the static electricity may more easily be dissipated.

Accordingly, when accumulated electric charge flows through the test pad 240, the level of static electricity is gradually decreased by the electrostatic preventing pattern 263 having the zigzag shape. Generally, the static electricity may be discharged at edges of the lines. Therefore, the accumulated electric charge flowing into the display cell 100a is decreased by the electrostatic preventing pattern 263, and the gate driving circuit 110, the transistor TR of the pixel P, and the like that are formed in the display cell 100a may be protected from the damage due to the static electricity.

Figure 4A:
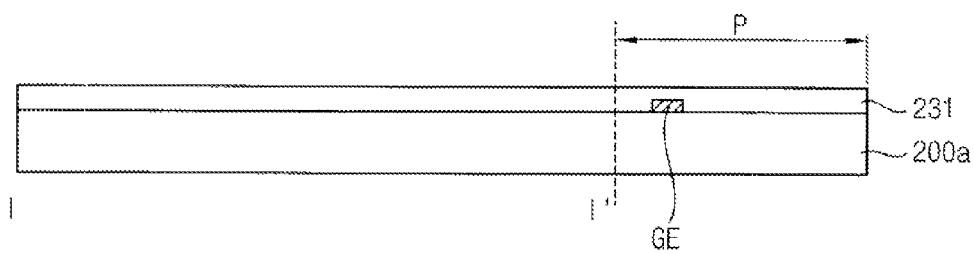
FIGS. 4A to 4C are cross-sectional views illustrating a method of manufacturing the mother substrate including the electrostatic preventing pattern of FIG. 3.
Figure 4B:
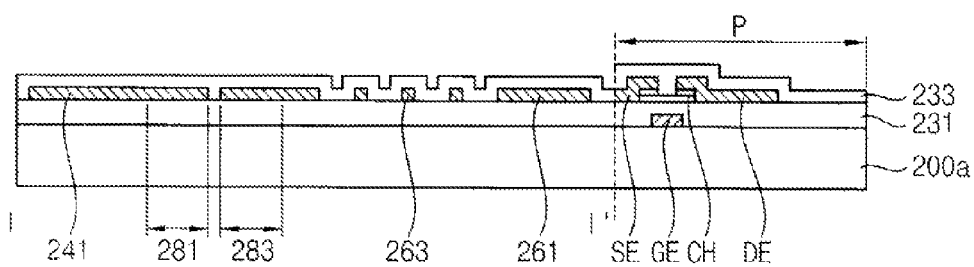
Figure 4C:
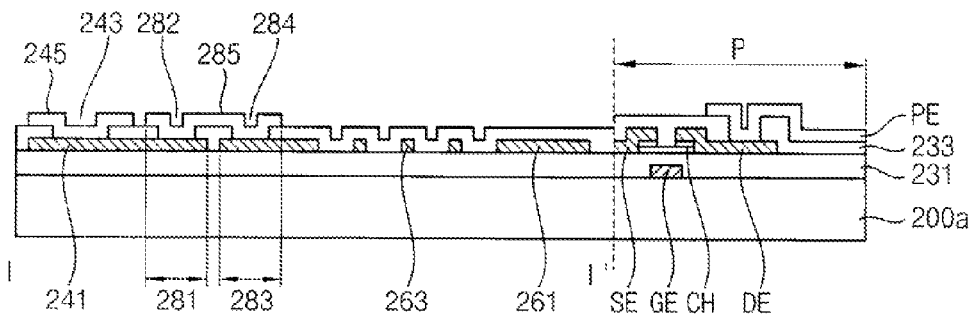

FIGS. 4A to 4C are cross-sectional views illustrating a method of manufacturing the mother substrate including the electrostatic preventing pattern of FIG. 3.

Referring to FIGS. 2, 3 and 4A, the mother substrate 200 includes a base substrate 200a. A first metal layer is formed on the base substrate 200a, and the first metal layer is patterned to form a first metal pattern. The first metal layer may be a single layer or a plurality of layers. The first metal pattern includes the gate lines GL, the storage lines STL and a gate electrode GE of the transistor TR of the display cell 100a.

A gate insulating layer 231 is formed on the base substrate 200a on which the first metal pattern is formed.

Referring to FIGS. 2, 3 and 4B, a channel layer is formed on the base substrate 200a on which the gate insulating layer 231 is formed, and the channel layer is patterned to form a channel pattern CH of the transistor TR.

The second metal layer is formed on the base substrate 200a on which channel pattern CH is formed, and the second metal layer is patterned to form a second metal pattern. The second metal layer may be a single layer or a plurality of layers. The second metal pattern includes the data lines DL, a source electrode SE and a drain electrode DE of the transistor TR of the display cell 100a. In addition, the second metal pattern includes the first pad electrode 241 disposed in the peripheral area of the display cell 100a, the connecting line 261, the electrostatic preventing pattern 263, the first end portion 281 and the second end portion 283. When viewed on a plane, the electrostatic preventing pattern 263 is formed in the zigzag shape.

The passivation film 233 is formed on the base substrate 200a on which the second metal pattern is formed.

Referring to FIGS. 2, 3 and 4C, the passivation film 233 is etched to form the contact holes 243, 282 and 284 that expose the second metal pattern.

A transparent conductive layer is formed on the base substrate 200a on which the contact holes 243, 282 and 284 are formed, and the transparent conductive layer is patterned to form the transparent electrode pattern. The transparent electrode pattern includes the pixel electrode PE of the display cell 100a, the second pad electrode 245 and the connecting electrode 285.

According to an exemplary embodiment, the electrostatic preventing pattern 263 may be more easily formed by changing one mask for patterning the second metal pattern in the conventional manufacturing process.

Hereinafter, substantially the same elements as described above are referenced to using the same reference numerals.

Figure 5:
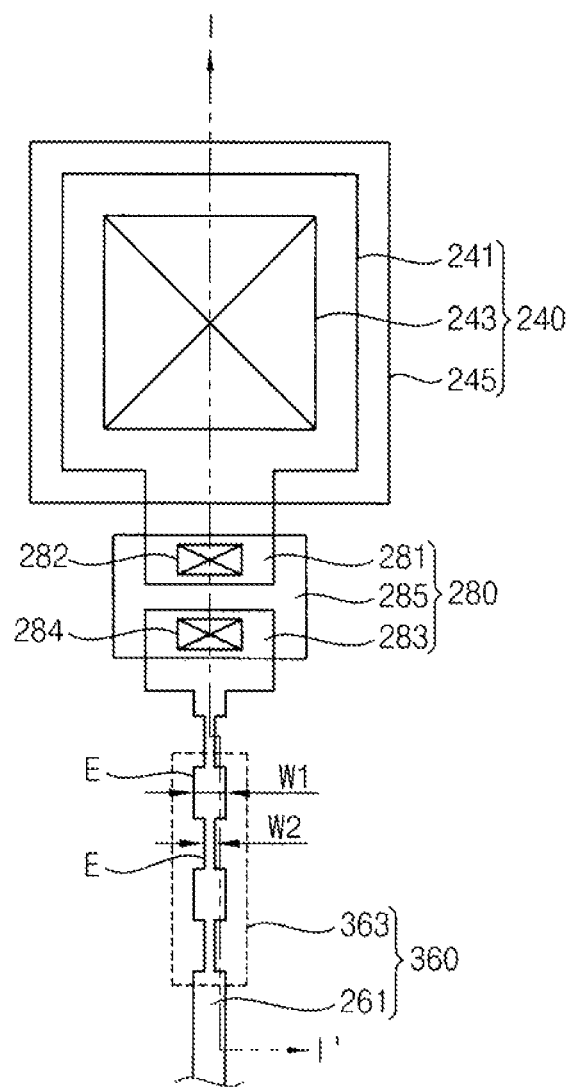
FIG. 5 is a plan view illustrating an electrostatic preventing pattern according to an exemplary embodiment of the present invention.

FIG. 5 is a plan view illustrating an electrostatic preventing pattern according to an exemplary embodiment of the present invention.

Referring to FIGS. 2 and 5, a mother substrate includes a test pad 240, a connecting line portion 360 and a connecting portion 280.

The test pad 240 includes a first pad electrode 241, a first contact hole 243 and a second pad electrode 245.

The connecting line portion 360 includes a connecting line 261 and an electrostatic preventing pattern 363 formed from the second metal layer. The connecting line 261 is extended from the electrostatic preventing pattern 363 and is electrically connected to the pad portion 130 of the display cell 100a. The electrostatic preventing pattern 363 is electrically connected to the connecting line 261 and is disposed adjacent to the test pad 240. The electrostatic preventing pattern 363 has a plurality of edges, and has a portion that is relatively wide and a portion that is relatively narrow in an alternating manner. The width W1 of the relatively wide portion may be changed according to an apparatus, and the width W2 of the relatively narrow portion may be less than or equal to half of the width W1. Alternatively, the relatively narrow width W2 may be in a range of between about ⅛ and about ½ of the relatively wide width W1. For example, the relatively wide width W1 may be in a range of between about 30 μm and about 50 μm, and the relatively narrow width W2 may be in a range of between about 5 μm and about 15 μm. For example, when the apparatus has a size of about 10.1 inches, the relatively wide width W1 may be about 40 μm and the relatively narrow width W2 may be about 10 μm.

According to exemplary embodiments of the present invention, within the electrostatic preventing pattern 363, static electricity tends to decrease when the width of a path is changed. Thus, the electrostatic preventing pattern 363 has the relatively wide portion with a width W1 and the relatively narrow portion with a width W2 in an alternating manner. Thus, an amount of accumulated electrical charge is decreased as it flows from the portion having the relatively wide width W1 to the portion having the relatively narrow width W2, or when the accumulated electrical charge flows from the portion having the relatively narrow width W2 to the portion having the relatively wide width W1. Further, the accumulated electrical charge flows through the portion having the relatively wide width W1 and the portion having the relatively narrow width W2 repeatedly, and the amount of accumulated electrical charge passing through the electrostatic preventing pattern 363 may be significantly decreased and thus static electricity may be significantly reduced.

Therefore, the gate driving circuit 110, the transistor TR of the pixel P, etc., formed in the display cell 100a may be prevented from being damaged due to the static electricity.

The connecting portion 280 includes a first end portion 281, a second contact hole 282, a second end portion 283, a third contact hole 284 and a connecting electrode 285. The first and second end portions 281 and 283 may be formed from the second metal layer and the connecting electrode 285 may be formed from the transparent conductive layer.

A method of manufacturing a mother substrate according to an exemplary embodiment of the present invention may be substantially the same as the approach discussed above with reference to FIGS. 4A to 4C. For example, as shown in FIG. 4C, the electrostatic preventing pattern 363 has the relatively wide portion having a width W1 and the relatively narrow portion having a width W2 formed from the second metal layer in the alternating manner. The method of manufacturing the mother substrate except for a pattern shape of the electrostatic preventing pattern 363 is substantially the same as that of the method of manufacturing the mother substrate according to the approach discussed above with reference to FIGS. 4A to 4C, and thus descriptions of substantially the same method will be omitted.

Accordingly, the electrostatic preventing pattern 363 may be more easily formed by changing one mask for patterning the second metal pattern in the conventional manufacturing process.

Figure 6:
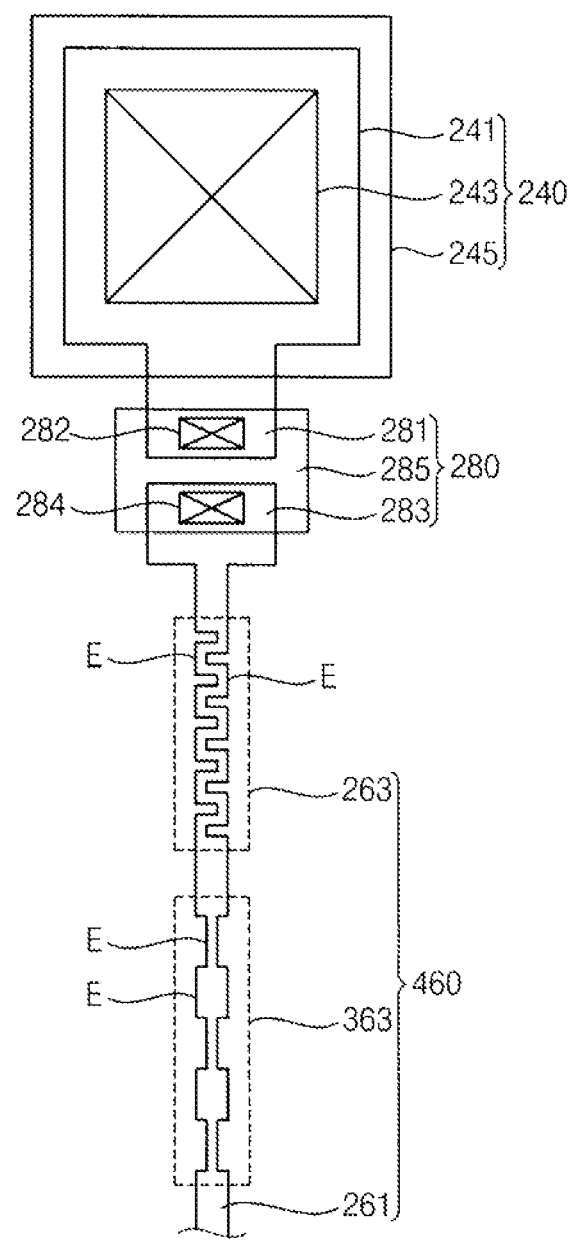
FIG. 6 is a plan view illustrating an electrostatic preventing pattern according to an exemplary embodiment of the present invention.

FIG. 6 is a plan view illustrating an electrostatic preventing pattern according to an exemplary embodiment of the present invention.

Referring to FIGS. 2 and 6, a mother substrate includes a test pad 240, a connecting line portion 460 and a connecting portion 280.

The test pad 240 includes a first pad electrode 241, a first contact hole 243 and a second pad electrode 245.

The connecting line portion 460 includes a connecting line 261, a first electrostatic preventing pattern 263 and a second electrostatic preventing pattern 363 formed from the second metal layer. The connecting line 261 is extended from the first electrostatic preventing pattern 263 or the second electrostatic preventing pattern 363 and is electrically connected to the pad portion 130 of the display cell 100a. The first electrostatic preventing pattern 263 has a zigzag shape, for example, as described above with respect to FIG. 3. The second electrostatic preventing pattern 363 is disposed adjacent to the first electrostatic preventing pattern 263 and has the relatively wide portions with the widths W1 and the relatively narrow portions with the widths W2 in an alternating manner, for example, as described above with respect to FIG. 5.

The first electrostatic preventing pattern 263 decreases the static electricity at the edges and the second electrostatic preventing pattern 363 decreases the static electricity at a portion of which the width is changed, for example, at the transitions between the relatively large and relatively narrow portions. The quantity of static electricity in the test pad 240 may be decreased by the first and second electrostatic preventing patterns 263 and 363. Therefore, the gate driving circuit 110, the transistor TR of the pixel P, etc., formed in the display cell 100a may be prevented from being damaged due to the static electricity.

The connecting portion 280 includes a first end portion 281, a second contact hole 282, a second end portion 283, a third contact hole 284 and a connecting electrode 285. The first and second end portions 281 and 283 may be formed from the second metal layer and the connecting electrode 285 may be formed from the transparent conductive layer.

A method of manufacturing a mother substrate according to an exemplary embodiment of the present invention may be substantially the same as that of the method of manufacturing the mother substrate described above with reference to FIGS. 4A to 4C. That is, as shown in FIG. 4C, the first and second electrostatic preventing patterns 263 and 363 are formed from the second metal layer.

Accordingly, the first and second electrostatic preventing patterns 263 and 363 may be more easily formed by changing one mask for patterning the second metal pattern in the conventional manufacturing process.

Figure 7:
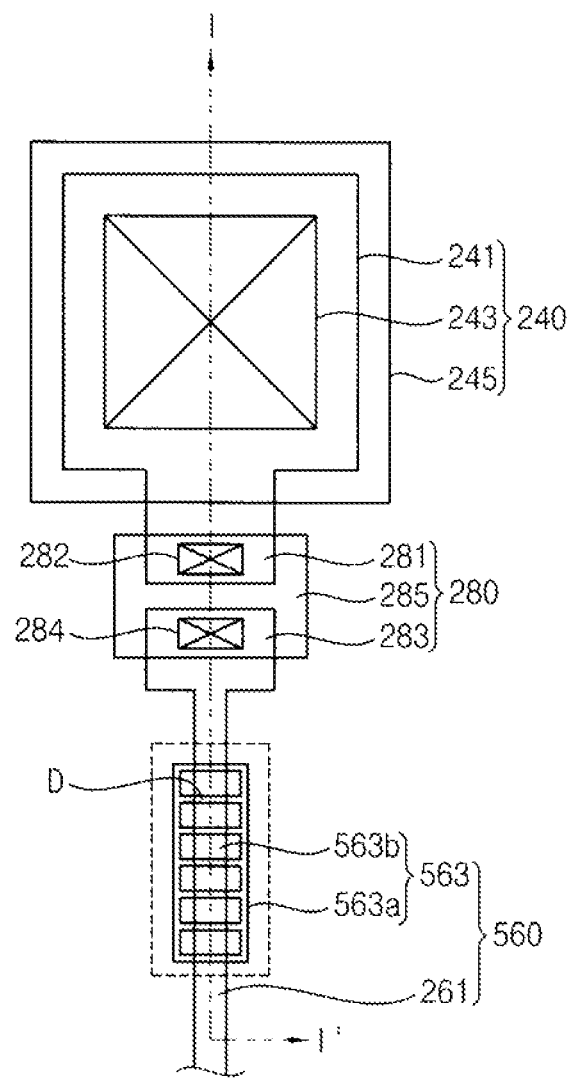
FIG. 7 is a plan view illustrating an electrostatic preventing pattern according to an exemplary embodiment of the present invention.

FIG. 7 is a plan view illustrating an electrostatic preventing pattern according to an exemplary embodiment of the present invention.

Referring to FIGS. 2 and 7, a mother substrate includes a test pad 240, a connecting line portion 560 and a connecting portion 280.

The test pad 240 includes a first pad electrode 241, a first contact hole 243 and a second pad electrode 245.

The connecting line portion 560 includes a connecting line 261 and an electrostatic preventing pattern 563.

The connecting line 261 is formed from the second metal layer. The electrostatic preventing pattern 563 includes a first preventing pattern 563a formed from the first metal layer and a second preventing pattern 563b formed from the second metal layer. The first preventing pattern 563a has a ladder shape having a plurality of patterns D that are discontinuously disposed, and the second preventing pattern 563b overlaps with the first preventing pattern 563a and has a plurality of stepped portions. The ladder shape includes two parallel lines that run vertically and a plurality of horizontal lines that connect the two vertical lines. The connecting line 261 is extended from the second preventing pattern 563b of the electrostatic preventing pattern 563 and is electrically connected to the pad portion 130 of the display cell 100a.

The connecting portion 280 includes a first end portion 281, a second contact hole 282, a second end portion 283, a third contact hole 284 and a connecting electrode 285. The first and second end portions 281 and 283 may be formed from the second metal layer, and the connecting electrode 285 may be formed from the transparent conductive layer.

The test signal applied to the test pad 240 is provided to the connecting line portion 560 through the connecting portion 280, and is provided to the pad portion 130 of the display cell 100a through the second preventing pattern 563b extended from the second end portion 283 of the connecting portion 280 and the connecting line 261. The accumulated electric charge from the test pad 240 flows through the second preventing pattern 563b. In this case, the second preventing pattern 563b has a plurality of stepped portions by the first preventing pattern 563a that has the ladder shape and is disposed under the second preventing pattern 563b. The height of each of the stepped portions is proportional to a thickness of the first preventing pattern 563a. The thickness of the first preventing pattern 563a may be in a range of between about 0.2 μm and about 0.3 μm, and the height of each stepped portion may be in a range of between about 0.2 μm and about 0.3 μm.

Accumulated electrical charge flowing through the second preventing pattern 563b is decreased at a spot where the stepped portions are changed and accordingly, a level of static electricity is reduced. Therefore, the gate driving circuit 110, the transistor TR of the pixel P, etc., formed in the display cell 100a may be prevented from being damaged due to the static electricity.

Figure 8A:
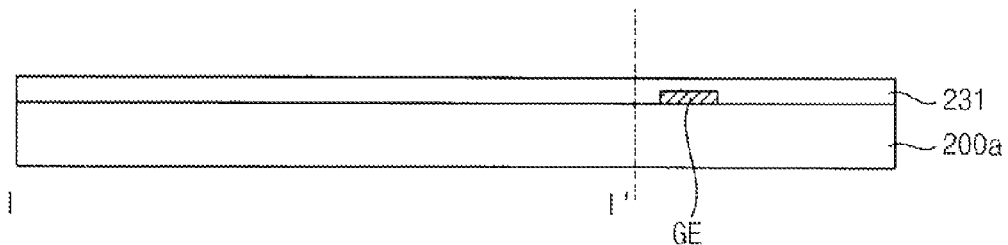
FIGS. 8A to 8C are cross-sectional views illustrating a method of manufacturing a mother substrate including the electrostatic preventing pattern of FIG. 7.
Figure 8B:
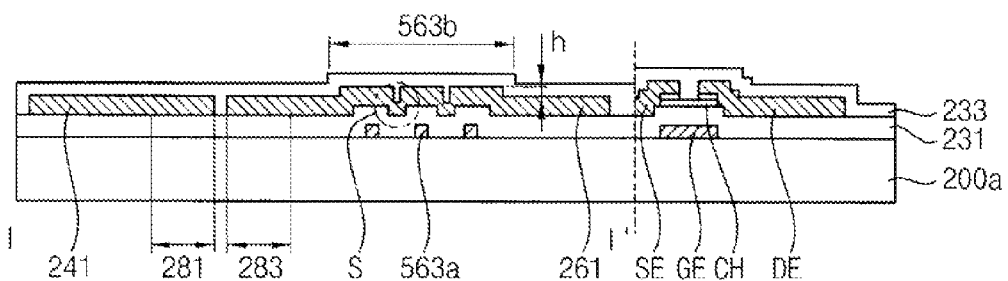
Figure 8C:
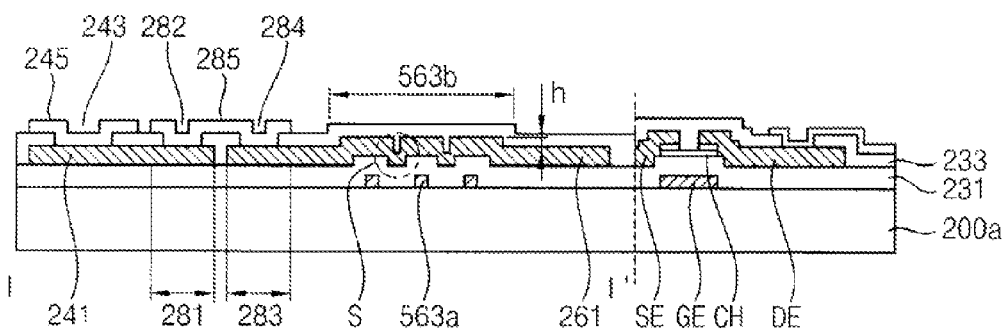

FIGS. 8A to 8C are cross-sectional views illustrating a method of manufacturing a mother substrate including the electrostatic preventing pattern of FIG. 7.

Referring to FIGS. 7 and 8A, the mother substrate includes a base substrate 200a. A first metal layer is formed on the base substrate 200a, and the first metal layer is patterned to form a first metal pattern. The first metal layer has a thickness within a range of between about 0.2 μm and about 0.3 μm, and the first metal pattern has a thickness of between about 0.2 μm and about 0.3 μm.

The first metal pattern includes the gate lines GL, the storage lines STL and a gate electrode GE of the transistor TR of the display cell 100a. The first metal pattern includes a first preventing pattern 563a having a plurality of patterns D that are discontinuously disposed. When viewed on a plane, the first preventing pattern 563a has a ladder shape.

A gate insulating layer 231 is formed on the base substrate 200a on which the first metal pattern is formed.

Referring to FIGS. 7 and 8B, a channel layer is formed on the base substrate 200a on which the gate insulating layer 231 is formed, and the channel layer is patterned to form a channel pattern CH of the transistor TR.

The second metal layer is formed on the base substrate 200a on which channel pattern CH is formed, and the second metal layer is patterned to form a second metal pattern. The second metal layer is formed in a range of between about 0.2 μm and about 0.3 μm, and the second metal pattern has a thickness of between about 0.2 μm and about 0.3 μm.

The second metal pattern includes the data lines DL, a source electrode SE and a drain electrode DE of the transistor TR of the display cell 100a. In addition, the second metal pattern includes the first pad electrode 241 disposed in the peripheral area of the display cell 100a, the connecting line 261, the second preventing pattern 563b of the electrostatic preventing pattern 563, the first end portion 281 and the second end portion 283. The second preventing pattern 563b is extended from the second end portion 283 and is connected to the connecting line 261. The second preventing pattern 563b overlaps with the first preventing pattern 563a having the plurality of patterns D that are discontinuously disposed, and has a plurality of stepped portions S by the plurality of patterns D. Each height h of the stepped portions S is based on the thickness of the first preventing pattern 563a. For example, the thickness of the first preventing pattern 563a is in a range of between about 0.2 μm and about 0.3 μm, and the height h of each stepped portion is in a range of between about 0.2 μm and about 0.3 μm. Accumulated electrical charge flowing through the second preventing pattern 563b may be decreased, as the electrical charge passes through the stepped portions S of the second preventing pattern 563b.

The passivation film 233 is formed on the base substrate 200a on which the second metal pattern is formed.

Referring to FIGS. 7 and 8C, the passivation film 233 is etched to form the contact holes 243, 282 and 284 exposing the second metal pattern.

A transparent conductive layer is formed on the base substrate 200a on which the contact holes 243, 282 and 284 are formed, and the transparent electrode pattern is formed by patterning the transparent conductive layer. The transparent electrode pattern includes the pixel electrode of the display cell 100a, the second pad electrode 245 and the connecting electrode 285.

Accordingly, the electrostatic preventing pattern 563 according to an exemplary embodiment of the present invention further includes the first preventing pattern 563a formed on the second preventing pattern 563b to form the stepped portion. The electrostatic preventing pattern 563 may be easily formed by changing one mask for patterning the first metal layer.

Figure 9:
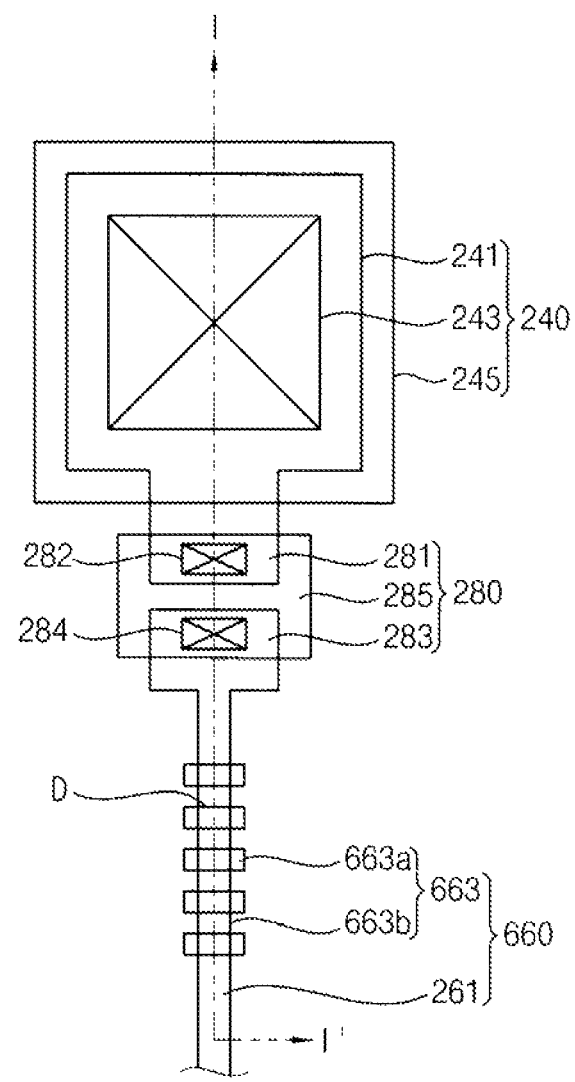
FIG. 9 is a plan view illustrating an electrostatic preventing pattern according to an exemplary embodiment of the present invention.

FIG. 9 is a plan view illustrating an electrostatic preventing pattern according to an exemplary embodiment of the present invention.

Referring to FIGS. 2 and 7, a mother substrate includes a test pad 240, a connecting line portion 660 and a connecting portion 280.

The test pad 240 includes a first pad electrode 241, a first contact hole 243 and a second pad electrode 245.

The connecting line portion 660 includes a connecting line 261 and an electrostatic preventing pattern 663. The connecting line 261 is formed from the second metal layer. The electrostatic preventing pattern 663 includes a first preventing pattern 663a formed from the first metal layer and a second preventing pattern 663b formed from the second metal layer. The first preventing pattern 663a has a stepping stone shape having a plurality of patterns D that are discontinuously disposed, and the second preventing pattern 663b overlaps with the first preventing pattern 663a and has a plurality of stepped portions. The stepping stone shape may be understood as an inversion of the ladder shape described above, and accordingly may include a sequence of horizontally arranged blocks. The connecting line 261 is extended from the second preventing pattern 663b of the electrostatic preventing pattern 663 and is electrically connected to the pad portion 130 of the display cell 100a.

The connecting portion 280 includes a first end portion 281, a second contact hole 282, a second end portion 283, a third contact hole 284 and a connecting electrode 285. The first and second end portions 281 and 283 may be formed from the second metal layer, and the connecting electrode 285 may be formed from the transparent conductive layer.

The test signal applied to the test pad 240 is provided to the connecting line portion 660 through the connecting portion 280, and is provided to the pad portion 130 of the display cell 100a through the second preventing pattern 663b extended from the second end portion 283 of the connecting portion 280 and the connecting line 261. The accumulated electric charge from the test pad 240 flows through the second preventing pattern 663b. In this case, the second preventing pattern 663b has a plurality of stepped portions by the first preventing pattern 663a that has the stepping stone shape and is disposed under the second preventing pattern 663b.

Accumulated electric charge flowing through the second preventing pattern 663b is decreased at a spot where the stepped portions are changed. Accordingly, a level of static electricity may be reduced. Therefore, the gate driving circuit 110, the transistor TR of the pixel P, etc., formed in the display cell 100a is prevented from being damaged due to the static electricity.

A method of manufacturing a mother substrate according to an exemplary embodiment of the present invention may be substantially the same as those of the method of manufacturing the mother substrate described above with reference to FIGS. 8A to 8C. For example, as shown in FIG. 8A, the first preventing pattern 663a having the stepping stone shape is formed from the first metal layer corresponding to the second preventing pattern 663b. Referring to FIG. 8B, the second preventing pattern 663b formed from the second metal layer may include a plurality of stepped portions S.

Accordingly, the electrostatic preventing pattern 663 further includes the first preventing pattern 663a formed on the second preventing pattern 663b to form the stepped portion, and the electrostatic preventing pattern 663 may be easily formed by changing one mask for patterning the first metal layer.

Figure 10:
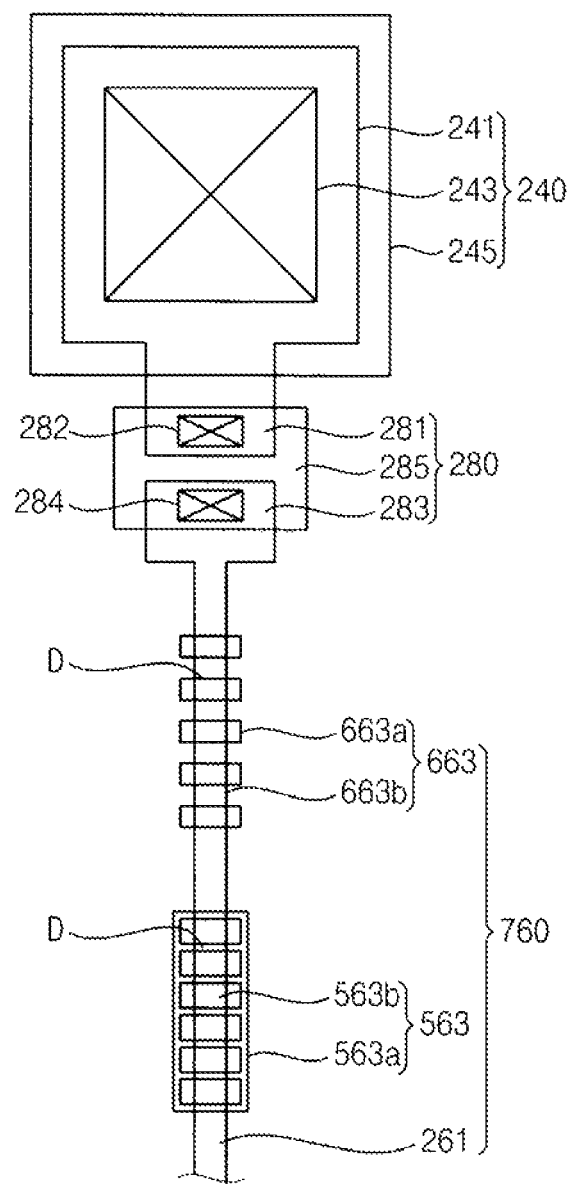
FIG. 10 is a plan view illustrating an electrostatic preventing pattern according to an exemplary embodiment of the present invention.

FIG. 10 is a plan view illustrating an electrostatic preventing pattern according to an exemplary embodiment of the present invention.

Referring to FIGS. 2 and 10, a mother substrate includes a test pad 240, a connecting line portion 760 and a connecting portion 280.

The test pad 240 includes a first pad electrode 241, a first contact hole 243 and a second pad electrode 245.

The connecting line portion 760 includes a connecting line 261, a first electrostatic preventing pattern 663 and a second electrostatic preventing pattern 563. The connecting line 261 is formed from the second metal layer. The first electrostatic preventing pattern 663 includes a first preventing pattern 663a formed from the first metal layer and a second preventing pattern 663b formed from the second metal layer. The first preventing pattern 663a has a stepping stone shape, and the second preventing pattern 663b overlaps with the first preventing pattern 663a. The second electrostatic preventing pattern 563 includes a third preventing pattern 563a formed from the first metal layer and a fourth preventing pattern 563b formed from the second metal layer. The third preventing pattern 563a has a ladder shape and the fourth preventing pattern 563b overlaps with the third preventing pattern 563a. The connecting line 261 is extended from the second preventing pattern 663b or the fourth preventing pattern 563b and is electrically connected to the pad portion 130 of the display cell 100a.

The connecting portion 280 includes a first end portion 281, a second contact hole 282, a second end portion 283, a third contact hole 284 and a connecting electrode 285. The first and second end portions 281 and 283 may be formed from the second metal layer, and the connecting electrode 285 may be formed from the transparent conductive layer.

The accumulated electric charge from the test pad 240 flows through the second preventing pattern 663b. In this case, the second preventing pattern 663b has a plurality of stepped portions by the first preventing pattern 663a that has the stepping stone shape and is disposed under the second preventing pattern 663b. The accumulated electric charge flowing through the second preventing pattern 663b is decreased at a spot where the stepped portions are changed. In addition, the accumulated electric charge flows through the fourth preventing pattern 563b. The fourth preventing pattern 563b has a plurality of stepped portions by the third preventing pattern 563a that has the ladder shape and is disposed under the fourth preventing pattern 563b. The accumulated electric charge flowing through the fourth preventing pattern 563b is decreased at a spot where the stepped portions are changed.

Therefore, by the first and second electrostatic preventing patterns 663 and 563, the gate driving circuit 110, the transistor TR of the pixel P, etc., formed in the display cell 100a may be prevented from being damaged due to the static electricity.

A method of manufacturing a mother substrate according to an exemplary embodiment of the present invention may be substantially the same as those of the method of manufacturing the mother substrate described above with respect to FIGS. 8A to 8C. For example, as shown in FIG. 8A, the first and third preventing patterns 663a and 563a having the ladder shape and the stepping stone shape are formed from the first metal layer corresponding to the second and fourth preventing patterns 663b and 563b. Referring to FIG. 8B, the second and fourth preventing patterns 663b and 563b formed from the second metal layer may have a plurality of stepped portions S.

Accordingly, the first and second electrostatic preventing patterns 663 and 563 further include the first and third preventing patterns 663a and 563a formed on the second and fourth preventing patterns 663b and 563b to form the stepped portion, and first and second electrostatic preventing patterns 663 and 563 may be easily formed by changing one mask for patterning the first metal layer.

The foregoing exemplary embodiments are illustrative of the present invention and are not to be construed as limiting thereof. Many modifications are possible in the exemplary embodiments without materially departing from the present invention.

What is claimed is:

1. A substrate for a display device, the substrate comprising:
 a display cell including a display cell pad and a signal line, the signal line extending from the display cell pad and being electrically connected to a pixel;
 a test pad projecting from the display cell, electrically connected to the signal line of the display cell, and receiving a test signal;

an electrostatic preventing pattern electrically connected to the test pad, disposed adjacent to the test pad, and including a first preventing pattern including a plurality of projections that are not connected to each other and a second preventing pattern overlapping the plurality of projections of the first preventing pattern, the second preventing pattern being a single contiguous pattern that includes a plurality of stepped portions that step down into spaces between the projections of the plurality of projections of the first preventing pattern; and a connecting line extended from the second preventing pattern and electrically connected to the display cell pad.

2. The substrate of claim 1, wherein a height of the stepped portions of the second preventing pattern is in a range of between about 0.2 μm and about 0.3 μm.

3. The substrate of claim 1, wherein the first preventing pattern has a ladder shape and the plurality of discontinuous projections form steps of the ladder shape.

4. The substrate of claim 1, wherein the first preventing pattern has a stepping stone shape.

5. The substrate of claim 1, wherein the electrostatic preventing pattern additionally comprises a third preventing pattern having a plurality of discontinuous projections and a fourth preventing pattern overlapping with the plurality of projections of the third preventing pattern.

6. The substrate of claim 5, wherein the first preventing pattern has a ladder shape and the third preventing pattern has a stepping stone shape.

7. The substrate of claim 1, further comprising a connecting portion electrically connecting the test pad to a connecting line portion including the connecting line and the electrostatic preventing pattern, wherein the connecting portion electrically connects an end portion of the test pad to an end portion of the connecting line portion that is spaced apart from the end portion of the test pad in a transparent electrode pattern.

8. The substrate of claim 7, wherein the test pad includes a first pad electrode, a first contact hole formed on the first pad electrode and a second pad electrode connected to the first pad electrode through the first contact hole.

9. The substrate of claim 8, wherein the first pad electrode comprises a metal, and the second pad electrode comprises a transparent conductor.

10. The substrate of claim 8, wherein the transparent electrode pattern includes a pixel electrode electrically connected to the transistor and the second pad electrode of the test pad electrically connected to the first pad electrode.

* * * * *